United States Patent [19]

Leuschner

[11] Patent Number: 4,755,750

[45] Date of Patent: Jul. 5, 1988

[54] WAFER KEYS FOR WAFER PROBE ALIGNMENT

[75] Inventor: Horst Leuschner, Phoenix, Ariz.

[73] Assignee: SGS Semiconductor Corporation, Phoenix, Ariz.

[21] Appl. No.: 32,995

[22] Filed: Apr. 2, 1987

Related U.S. Application Data

[63] Continuation of Ser. No. 721,166, Apr. 8, 1985, abandoned.

[51] Int. Cl.⁴ .................... G01R 31/00; G01B 11/00
[52] U.S. Cl. ................................ 324/158 R; 356/401
[58] Field of Search ............... 324/158 F; 356/400, 356/401; 430/5, 22; 33/286; 414/754, 757, 783

[56] References Cited

U.S. PATENT DOCUMENTS

| | | | |
|---|---|---|---|
| 4,356,223 | 10/1982 | Iida et al. | 33/286 |
| 4,419,013 | 12/1983 | Heimer | 356/400 |
| 4,521,114 | 6/1985 | Van Peski et al. | 356/401 |
| 4,540,277 | 9/1985 | Mayer et al. | 356/401 |

Primary Examiner—Ernest F. Karlsen
Attorney, Agent, or Firm—M. David Shapiro

[57] ABSTRACT

The invention comprises a system of alignment key patterns, within the scribe lines of a semiconductor chip, which allow more accurate placement of wafer probes, and more accurate location of fuses for the purposes of blowing selected ones of those fuses by means of laser energy.

4 Claims, 1 Drawing Sheet

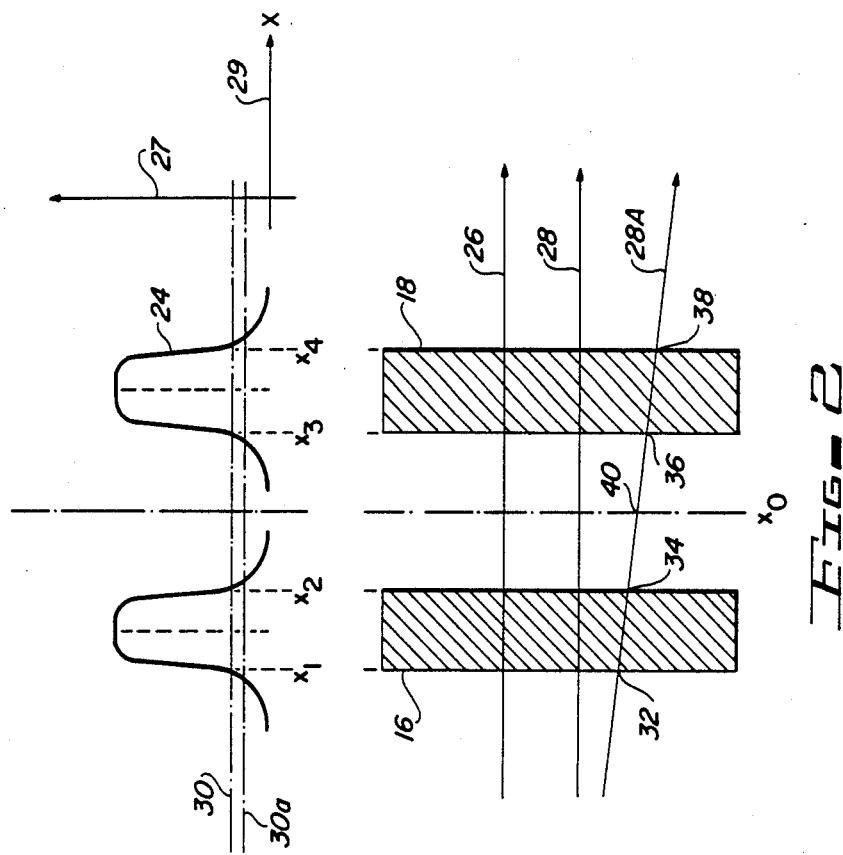
FIG-2A
FIG-2
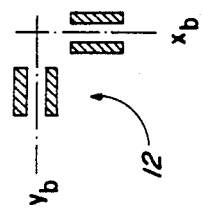
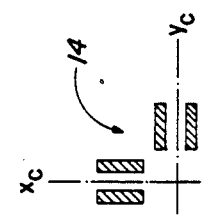
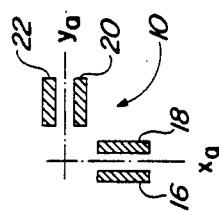
FIG-1

WAFER KEYS FOR WAFER PROBE ALIGNMENT

This application is a continuation of application Ser. No. 721,166 filed Apr. 8, 1985, now abandoned.

FIELD OF THE INVENTION

The invention relates to an improved pattern of alignment keys on a semiconductor wafer which may be used to automatically and more accurately and expeditiously align test probes and laser systems with the geometries of chips on the wafer.

BACKGROUND OF THE INVENTION

When a semiconductor chip is tested for the first time, it is tested in wafer form; that is, there are many chips on a single wafer at the time of first test. Testing is accomplished by alignment of a probe card having as many probe needles as does the chip have connection pads. The probe needles are electrically connected to the testing machine allowing that machine to interconnect with the chip under test.

Alignment is accomplished either by manually (visually) scanning the wafer with the aid of a microscope or by viewing the wafer on a video monitor, while manually moving the wafer stage in the X and Y (lateral) directions and while, at the same time, adjusting the stage for axial rotation of the wafer to correct for rotational alignment error. The process is tedious and prone to error since it relies completely upon human judgment.

In recent years, it has become a common practice to include fusible links as a part of certain chip designs to allow selection or deselection of circuits on the chip at the time of initial testing. This practice has reulted in even closer attention being given to the alignment problem stated, above, so that a laser beam may be closely aligned to a given fusible link thereby allowing the selected link to be blown by the application of laser energy to it.

The laser "repair" system has the capability of recognizing certain highly reflective geometries (a key pattern) on a wafer with an accuracy within approximately 150 microns of its actual location. Alignment of the laser coordinate system or the wafer stage is then made to that alignment key pattern. Prior art practice is to place the key patterns in the scribe grid which lies between chips on the wafer. While this practice avoids the use of valuable chip "real estate", frequently the keys so placed are not sufficient to allow both X, Y offset correction, theta rotational correction, X-scale magnification correction and Y-scale magnification correction.

Very large scale integrated (VLSI) circuits are made by direct wafer steppers (DSW). This means that every print of a reticle on the wafer can have a translational and/or rotational misalignment with respect to a virtual absolute grid. Such a reticle usually contains at least two (or more) chips in a cluster for several reasons. First, if the reticle contains more than one chip, less stepping operations are required to step the chips across the wafer. Second, if more than one identical chip is on one reticle, a mask comparator can be used to find a random mask defect by comparing a video image of one chip to the next chip in the same reticle. Any differences may be legitimately attributed to random defects. With such a cluster arrangement, a chip may have different scribe grids on different sides of the chip. For example, where there are two chips in a reticle, there will be a full scribe line between the two chips in the middle of the reticle and one-half scribe line on the right, left, top and bottom sides of the reticle. Toward the edge of the reticle, and in place of the half scribe line, one chip could have a full scribe line and the other, none at all.

Where chips are stepped repetitively across a wafer, the full scribeline to the right of one chip is, at the same time, the left full scribeline of the chip stepped next to it. The scribeline between the chips is precisely that; a scribeline, and it has a width just sufficient for scribing a wafer for separation of the chips. In contrast, the scribeline toward the edge of the reticle must contain the alignment keys for the stepper alignment. The two chips on the reticle are self aligned with respect to each other, but this two chip cluster must be accurately aligned to the corresponding image on the wafer. Thus the scribeline around the perimeter of the reticle can have a different width than the scribeline in the middle of the reticle.

One can now appreciate the difference between the reticle alignment keys and the laser alignment keys. The reticle alignment keys are required only once per reticle but the laser alignment keys are required for every chip. It is absolutely impossible to put the laser alignment keys into the scribe grid if the scribe grid in the middle of the reticle has a width different from that in the perimeter of the reticle.

There are two expensive ways to solve the problem in the prior art. First, the scribe grid in the middle of the reticle can be made as wide as the larger grid at the perimeter of the reticle (which is larger because it contains the reticle alignment keys). This wastes silicon area and does not solve the laser key correlation problem, yet to be described. Second, the scribe at the edge (or perimeter) of the reticle could be made to equal a full width scribeline, all the way around, so that when the reticle is stepped, one full width scribeline is touching another. This method would correlate the laser alignment keys to the chip but there would be adjacent keys in each corner, one belonging to the left chip and one to the right chip and the automatic alignment system might very well mistake one for the other. Another problem with the latter approach is that (as above) it wastes too much silicon area.

Since many advanced steppers do a site by site alignment, the blind stepping accuracy is quite poor; for example, three micron accuracy for blind stepping from one reticle image to the next. For any laser alignment key placement method in which the alignment in the right hand scribe of the reticle serves as the left hand alignment key for the chip to the right side, the laser or prober alignment accuracy is the built in inaccuracy plus the blind stepping inaccuracy of the DSW. This total inaccuracy affects not only the X and Y offset, but also the magnification sensitivity and in most cases leads to a miss of the fusible link to be repaired.

SUMMARY OF THE INVENTION

The foregoing shortcomings and problems with prior art keying systems are resolved means of the key system pattern of the invention by placing a group of three sets of unique key patterns within the chip area of the silicon. This allows generation of the keys as a part of the data base for the chip masks. The key patterns are placed as far apart as possible within the chip area and as close as possible to the repair fuses. This technique provides for 100% correlation between the laser alignment keys and the chip structure, whether that structure be a laser repair fuse or a bonding pad.

It is, therefore, an object of the invention to place laser keys on a semiconductor wafer within the chip perimeter.

It is another object of the invention to place laser keys on a semiconductor wafer within the chip perimeter and as close as possible to the repair fuses on the chip.

It is yet another object of the invention to place laser keys on a semiconductor wafer within the chip perimeter and as close as possible to the repair fuses on the chip and to arrange them in groups of three sets of keys to provide X, Y and rotational offset and X and Y scaling information for a prober or a laser repair beam.

The invention will be more readily understood after review of the Detailed Description of the Invention, infra, taken together with the drawings in which:

FIG. 1 is a plan view of a set of keys which comprise the improved key pattern of the invention;

FIG. 2 is a plan view of a single pair of key stripes; and

FIG. 2A is a graph of the electrical response from a laser probe system which is coordinated with the position of the key stripes of FIG. 2.

DETAILED DESCRIPTION OF THE INVENTION

FIG. 1 depicts, in plan view, a preferred embodiment of the key pattern of the invention. Three sets of key patterns, 10, 12, and 14 are disposed, preferably as metal stripes, at relatively widely spaced locations on the chip and within the chip perimeter (not shown). (Of course, FIG. 1 is not drawn to scale since patterns 10, 12, 14 would appear too small to discern if it were.) Sets 10, 12, and 14 of patterns should be located as close as possible to repair fuse locations on the chip in order to provide the maximum possible accuracy in automatically locating those fuse locations.

Within each of sets 10, 12, and 14 of key patterns, there are four stripes, shown typically at 16, 18, 20 and 22. Stripes 16 and 18 make up a vertical parallel pair of stripes and stripes 20 and 22 make up a horizontal parallel pair of stripes. When a laser sensor travels 26 over a pair of key stripes, for example 16 and 18, as shown in FIG. 2, signal 24 is generated, as shown in FIG. 2A. The amplitude (on abscissa 27 of the graph of FIG. 2A) of signal 24 represents the intensity of the reflected light and the ordinate 29 represents time (and space) traveled by the beam along the X-axis. Similarly, the same result attains in the Y-axis.

It should be noted that the longer dimensions of stripes 16–22 are long enough to allow for some misalignment of the laser system. It does not matter whether the laser beam crosses stripes 16 and 18 on line 26 or on line 28. Furthermore, it will be seen that if line 26 or 28 is not perpendicular to stripes 16 and 18, as seen at line 28A, the system is self correcting insofar as the actual positional accuracy of the determination of the location of $X_0$ on the X axis. The calculation of $X_0$ is accomplished by looking at the time at which signal 24 crosses a threshold level 30. (See FIG. 2A.) Those times may be represented by $X_1$, $X_2$, $X_3$ and $X_4$, which in reality are spacial distances, but are proportional to the time of crossing assuming that the beam travels at a steady rate. The calculation is as follows:

$$X_0 = (X_1 + X_2 + X_3 + X_4)/4 \qquad (1)$$

Equation (1) will clearly supply the value (or position) of $X_0$ even if threshold level 30 varies up or down, for example to leval 30A. If scan path 26 or 28 is not perpendicular to stripes 16 and 18, that fact is also automatically corrected for by equation (1). The geometries of the patterns are such that these automatic corrections are built into the system.

For example, if the scanning beam crosses stripes 16 and 18 on an angle as shown at line 28A, the time (and space) between points 32 and 34 are equal to the time (and space) between points 36 and 38, the crossing points. These errors offset each other and the calculation of point 40 on ordinate.line $X_0$ is still accurate.

Furthermore, if threshold level line 30 were to shift to the location shown at line 30a (or to any other reasonable level), due to a long term drift in amplifiers or other phenomona, the result is the same: The accuracy of location of $X_0$ is just as precise because of the symmetry of the stripes and of the sensor system and its circuits.

The key pattern stripes are used to determine absolute position (within the tolerances of the system) of Xa, Ya, Xb, Yb, Xc and Yc in FIG. 1 in the same manner as was described above in equation (1) for determining the absolute position of X0 in FIG. 2. Once these absolute positions are attained, it may be seen that other useful information can be derived: Note:

| Positional Information | Function | (Item below) |
|---|---|---|
| Xa, Ya | Offset | 1 |
| Xb, Xc | Theta (rotation) | 2 |
| Xa, Xb | X-Magnification | 3 |
| Ya, Yc | Y-Magnification | 4 |

1. Xa and Ya can be used as a basic coordinate point from which to locate all points on the chip.
2. The distance Xb minus Xc should be equal to a known quantity if the chip is not off in rotational position, but that difference is greater than the known distance if the chip is rotated from a "square" position.
3. The value of Xb minus Xa is a measure of the X-Magnification (scaling).
4. The value of Yc minus Ya (or Yb) is a measure of Y-Magnification (scaling), once Ya is made to equal Yb or once Ya is corrected mathematically to equal Yb.

While the invention has been particularly shown and described herein with reference to preferred and other embodiments thereof, it will be understood by those skilled in the art that various modifications and changes may be made to the instant invention utilizing the principles of the invention as described herein without departing from the spirit and scope thereof as encompassed in the accompanying claims. Therefore, it is intended in the accompanying claims to cover all such equivalent variations as come within the scope of the invention as described.

What is claimed is:

1. An improved system of alignment keys for each of a plurality of semiconductor chip on a wafer, each of the plurality of semiconductor chips on the wafer being defined by a set of four scribe lines defining a rectangular perimeter about the semiconductor chip, the system comprising:

first key means being disposed on each of the chips within the perimeter and near a first scribe line of the four scribe lines;

second key means being disposed on each of the chips within the perimeter and near said first scribe line; and third key means being disposed on each of the chips within the perimeter and near a second scribe line of said four scribe lines, said second scribe line being parallel to said first scribe line, said first and second key means being located so that a straight line drawn through a corresponding portion of said first and second key means is essentially parallel to said first scribe line and said first scribe line and said second scribe line being essentially parallel each to the other and located on opposite sides of the chip, each of said first, second and third key means further comprising:

a first pair of parallel stripes; and a second pair of parallel stripes, said first pair of parallel stripes being parallel to said first and second scribe lines, said second pair of parallel stripes being perpendicular to said first pair of parallel stripes.

2. The improved key system according to claim 1 wherein each of said stripes comprising each of said key means is disposed on each of the plurality of chips as a metal deposition, said first, second and third key means being located within said perimeter and outside of a device area on each of said plurality of chips.

3. The improved key system according to claim 1 wherein said first and second key means are located between said first scribe line and a device area on each of said plurality of semiconductor chips and said third key means is located between said second scribe line and said device area on each of said plurality of semiconductor chips.

4. The improved key system according to claim 3 wherein said parallel pairs of stripes are disposed upon each of said plurality of semiconductor chips as a metal deposition.

* * * * *